United States Patent
Tseng et al.

(10) Patent No.: US 6,755,602 B2
(45) Date of Patent: Jun. 29, 2004

(54) WAFER TRANSPORT POD WITH LINEAR DOOR OPENING MECHANISM

(75) Inventors: Hsien-Hua Tseng, Pingtung (TW); Chia-Hung Chung, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 96 days.

(21) Appl. No.: 10/072,704

(22) Filed: Feb. 7, 2002

(65) Prior Publication Data

US 2003/0147728 A1 Aug. 7, 2003

(51) Int. Cl.[7] ............................................. B65G 49/07
(52) U.S. Cl. ........................ 414/217; 414/940; 206/710
(58) Field of Search .............................. 414/217, 217.1, 414/411, 940; 206/710, 711; 220/324, 325

(56) References Cited

U.S. PATENT DOCUMENTS

| | | | | |
|---|---|---|---|---|
| 5,607,276 A | * | 3/1997 | Muka et al. ........... 414/331.18 |
| 5,752,796 A | * | 5/1998 | Muka ....................... 414/217.1 |
| 5,957,292 A | * | 9/1999 | Mikkelsen et al. ......... 206/710 |
| 5,967,571 A | * | 10/1999 | Gregerson .................... 292/33 |
| 6,340,933 B1 | * | 1/2002 | Chen et al. ................. 340/687 |
| 6,382,896 B1 | * | 5/2002 | Hu et al. ..................... 414/217 |

* cited by examiner

Primary Examiner—Dean J. Kramer
(74) Attorney, Agent, or Firm—Tung & Associates

(57) ABSTRACT

A pod for transporting a cassette of semiconductor wafers that is equipped with a linearly operated door opening/closing mechanism is provided. The pod includes a body member, a cover member and a latch carried on the covet member for latching the cover member onto the body member. The latch is actuatable and operable linearly from a latched condition in which the cover member is latched onto the body member to a released condition allowing removal of the cover member from the body member when engaged linearly by a latch key of a door opener situated in a loadport onto which the cassette pod is positioned.

6 Claims, 2 Drawing Sheets

WAFER TRANSPORT POD WITH LINEAR DOOR OPENING MECHANISM

FIELD OF THE INVENTION

The present invention broadly relates to semiconductor wafer processing equipment, and deals more particularly with an improved pod employed to protectively enclose and transfer a cassette containing a plurality of semiconductor wafers.

BACKGROUND OF THE INVENTION

The high level of automation used in fabricating semiconductor devices relies on sophisticated handling and transport equipment for moving semiconductor wafers between various processing stations. Most handling and transport operations are conducted under automatic control using a programmed computer which issues control signals for operating the equipment with little or no intervention by an operator. In many systems, standard mechanical interface (SMIF) pods are used to transport batches of wafers that are stored in cassettes. These pods include a base upon which the cassettes rest, and a cover removably secured to the base and completely enclosing the cassette. The cover protectively surrounds the cassette, and thus the wafers, from the surrounding environment which may contain airborne, contamination particles. SMIF pods are most often used to transport cassettes from one clean room environment to another, where during the transport movement, the wafers, if not covered, are exposed to the contaminating environment. In more recent development, FOUP's (front open unified pod) are used for storing and transporting 12" wafers.

After a pod has reached the vicinity of a processing station within a protected, clean room environment, it is necessary to remove the cover so that automated wafer transfer robots can gain access the individual wafers held in the cassette. The covers are held on the pods by various types of latching mechanisms which are automatically actuated to latch and unlatch the cover by means of actuating controls positioned at each processing station. Thus, when a pod reaches a processing station, control mechanisms engage the latch mechanism on the pod to unlatch the cover, following which either an operator or a robotic mechanism removes the cover to expose the cassette. Following processing of a batch of wafers in the cassette, the cover is reinstalled on the pod base, either manually or robotically, after which the control mechanism is actuated to latch the cover on the base (for SMIF) or on the back (for FOUP) before the pod leaves the processing station.

In spite of the fact that positive latch mechanisms are employed to lock the cover on the pod base, occasions arise when, for a variety of reasons, the latch fails to lock the cover on the pod base. This may occur, for example, when a foreign article becomes lodged between the cover and the base or where the cassette becomes tilted on the base, thus interfering with proper seating of the cover. In other cases, the control mechanism for actuating the latch may malfunction. In many cases, failure of the latch mechanism to lock the cover on the pod base goes undetected by process operators. As a result, it is possible that contaminants may pass between the pod base and cover when the pod leaves the clean room environment, thereby resulting in possible contamination of the wafers.

Accordingly, there is a clear need in the art for an improved pod construction which insures that the cover is properly locked onto the pod. The present invention is directed toward satisfying this need in the art.

FIG. 1 illustrates a cassette pod such as a FOUP that is installed on a process machine. The cassette pod 10 is positioned on a loadport 12 of the process machine 14. The loadport 12 is normally equipped with a plurality of locating pins 16 for the proper positioning of the cassette pod 10.

A detailed perspective view of the cassette pod, i.e. the FOUP 10, is shown in FIG. 4A. The FOUP 10 is constructed by a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18 is provided a plate member 52 for gripping by a transport arm (not shown) of an overhead hoist transport system. It should be noted that, for simplicity reasons, the latching mechanism for opening and closing the FOUP door, or the cover portion 28, is not shown in FIG. 2.

In the conventional cover member, or door 28 of the FOUP 10, the door opening/closing mechanism is shown in FIG. 3 in a plane view. Locking tabs 20a, 20b, 22a and 22b are provided at the top and at the bottom of the cover member 28. Circular drive plates 24a and 24b are connected to the locking tabs 20a–22b by mechanical linkage 26a and 26b and operated by latch holes 28a and 28b. A pair of latch keys (not shown) that are part of the door opener mechanism of the loadport (not shown) are inserted into the latch holes 28a and 28b and turned by a DC motor to lock or unlock the cover member 28 to the loadport opening. As shown in FIG. 3, when the drive plates 24a and 24b are turned in a clockwise direction, the locking tabs 20a, 20b, 22a and 22b are withdrawn into the frame of the cover member 28 and therefore, unlocking the cover member 28 from the body member 18 of the cassette pod 10 (shown in FIG. 2). Conversely, when the drive plates 24a and 24b are turned by the DC motor in a counter-clockwise direction, the locking tabs 20a, 20b, 22a and 22b are extended out of the frame of the cover member 28 to engage receptacles (not shown) in the body member 18 and thus, locking the cover member 28 to the body member 18 of the cassette pod 10.

Problems occur when operating the conventional door opening/closing mechanism shown in FIG. 3 installed on a FOUP. For instance, the latch keys (not shown) that are turned by the DC motor sometimes are misaligned with the latch holes 28a and 28b and thus, the door opening or closing operation cannot be carried out. Secondly, the torque of the DC motor cannot always be precisely controlled such that the angle of turning, i.e. such as a 90° angle cannot be precisely controlled. A door opening or closing mechanism can not be completely executed when the angle of rotation is not exactly 90°. For instance, during a door locking operation, if the latch holes 28a and 28b are not turned to a perfect horizontal position in order to lock the cover member 28 to the body member 18 and when the FOUP 10 is later positioned on another process equipment, a similar set of door opening latch keys could not be inserted into the latch holes 28a and 28b and thus, the member 28 cannot be opened or unlocked from the body member 18.

It is therefore an object of the present invention to provide a pod for transporting a cassette of semiconductor wafers that does not have the drawbacks or shortcomings of the conventional pods.

It is another object of the present invention to provide a pod for transporting a cassette of semiconductor wafers that does not require a rotary-type door opening/closing mechanism.

It is a further object of the present invention to provide a pod for transporting a cassette of semiconductor wafers that utilizes a linear-type door opening/closing mechanism.

It is another further object of the present invention to provide a pod for transporting a cassette of semiconductor wafers by providing the cover member of the pod with locking tabs, drive plate and latch holes for engagement by latch keys provided on a door opening plate of a loadport.

SUMMARY OF THE INVENTION

In accordance with the present invention, a wafer transport pod that is equipped with a linear door opening mechanism is provided.

In a preferred embodiment, a pod for transporting a cassette of semiconductor wafers is provided which includes a body member constructed of a top wall, a bottom wall, a front wall and two sidewalls forming a back opening for loading or unloading wafers into or out of the pod body; a cover member for sealingly and removably engaging the back opening of the body member; and latch means carried on the cover member for latching the cover member onto the body member, the latch means is actuatable and operable linearly from a latched condition in which the cover member is latched onto the body member to a released condition allowing removal of the cover member from the body member when engaged linearly by a latch key of a door opener situated in a loadport onto which the pod is positioned.

In the pod for transporting a cassette of semiconductor wafers, the latch means may further include at least two locking tabs for engaging receptacles provided in the body member. The at least two locking tabs are operated in a linear manner when engaging or disengaging the receptacles. The latch means may further include two latch holes for linearly engaging the latch keys of the door opener in the loadport. Each one of the two latch keys operates at least one locking tab for engaging one of two opposite sides of a loadport opening. The two latch holes move in a linear manner to linearly engage at least two locking tabs of the latch means to an opening of the loadport. The at least two locking tabs are spring-loaded for returning the at least two locking tabs to a disengaged position.

The present invention is further directed to a pod for transporting a cassette of semiconductor wafers which include a body member which is constructed of a top wall, a bottom wall, a front wall and two sidewalls forming a back opening for loading or unloading wafers into or out of the body member; a cover member for sealingly and removably engaging the back opening of the body member; and latch means carried on the cover member for latching the cover member onto the body member, the latch means may further include at least two locking tabs with at least one operating on one of two opposing sides of the cover member for engaging receptacles provided in the body member; and at least two latch holes with one connected to and linearly operates the at least one locking tab when the latch hole is engaged by a latch key of a door opener situated in the loadport.

The pod for transporting a cassette of semiconductor wafers may further include four locking tabs with two situated on each opposing side of the cover member. The at least two locking tabs are spring-loaded. The pod may further include an indicator means which includes means responsive to the position of the at least two latch holes to produce a signal related to the condition of the latch means. The latch means may further include a drive plate operably connected to the at least two locking tabs such that the at least two locking tabs are drivable by the drive plate to shift the latch means between a latching and an unlatching condition.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
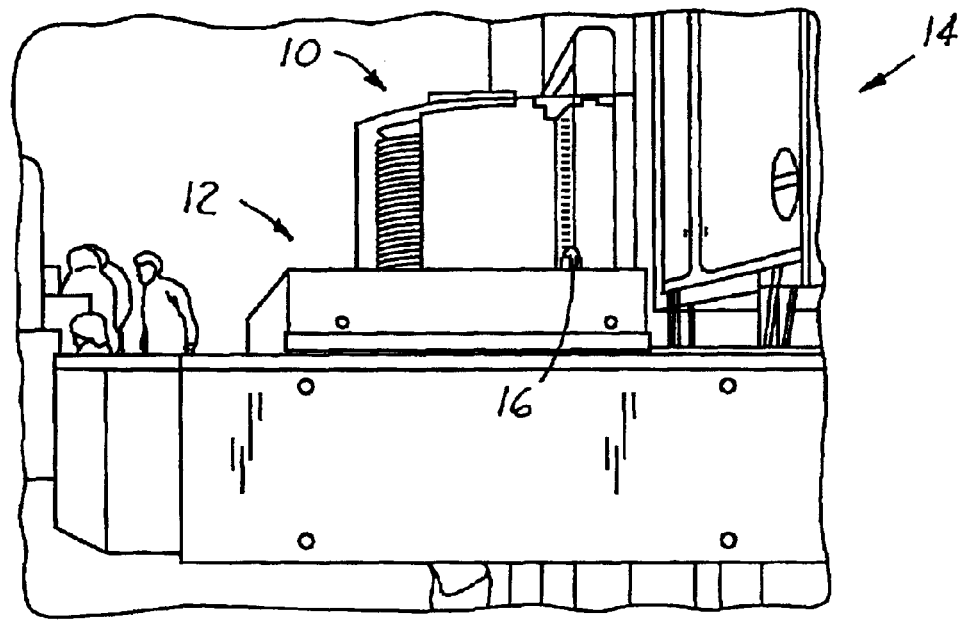
FIG. 1 is a perspective view of a conventional cassette pod positioned on a loadport of a process equipment.
Figure 2:
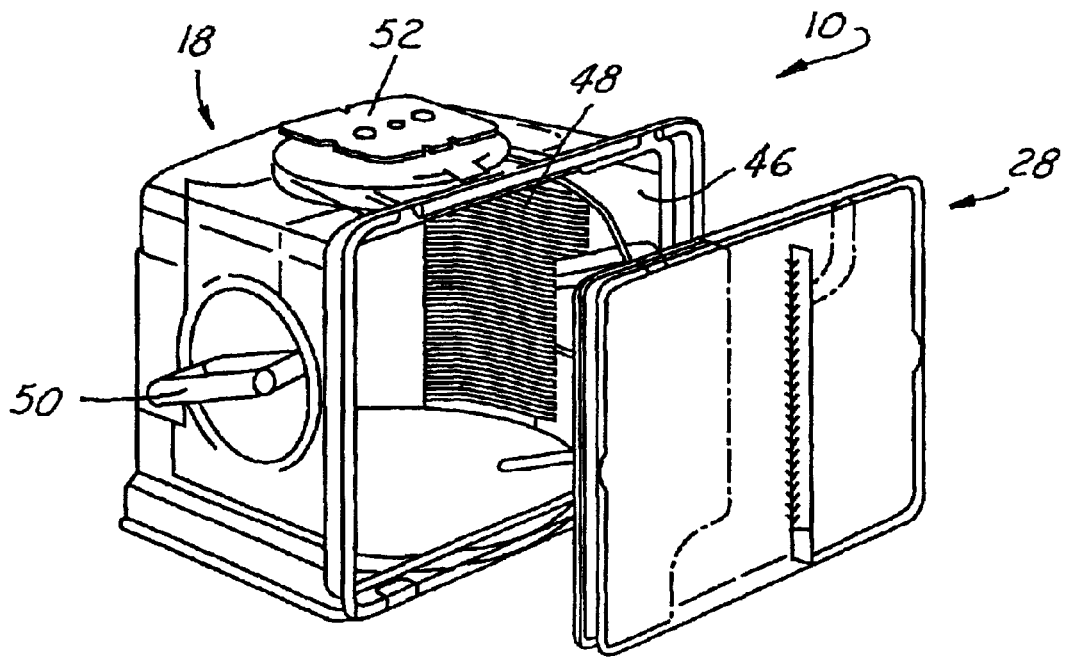
FIG. 2 is a perspective view of a conventional cassette pod for 12" wafers and a cover member for the pod.
Figure 3:
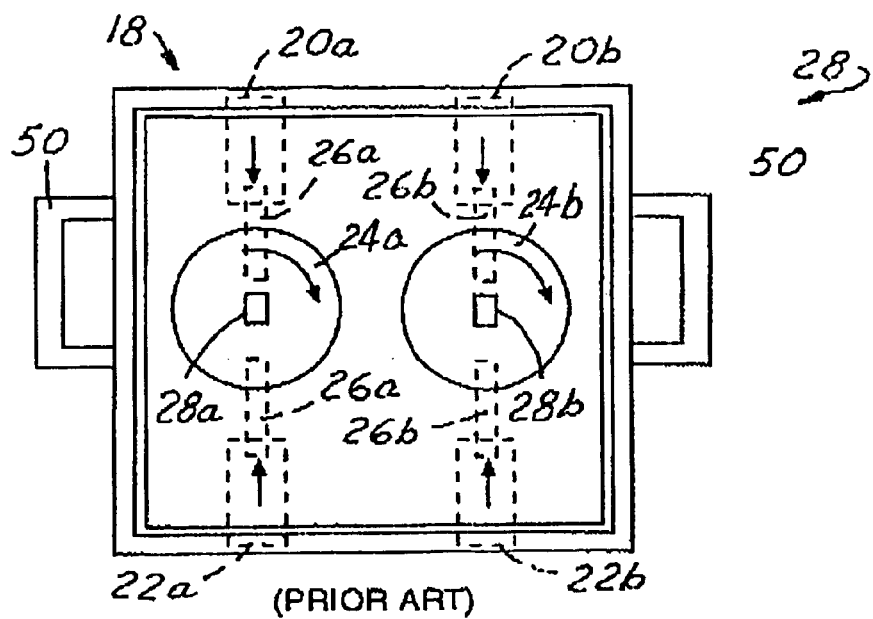
FIG. 3 is a rear view of the conventional cassette pod FIG. 2 illustrating the door opening/closing mechanism.

The present invention discloses a pod for transporting a cassette of semiconductor wafers which includes a body member for the pod, a cover member for the pod, and a latch means carried on the cover member for latching the cover member to the body member.

In the preferred embodiment, the body member is constructed of a top wall, a bottom wall, a front wall and two sidewalls to form a back opening for loading or unloading wafers into or out of the body member. A cover member is used to sealingly and removable engage the back opening of the body member. A latch means is installed on the cover member for latching the cover member onto the body member. The latch means is actuatable and operable linearly from a latched position in which the cover member is locked onto the body member to a released position allowing removal of the cover member from the body member when engaged linearly by a latch key of a door opener situated in a loadport onto which the pod is positioned.

The latch means may further include at least two locking tabs, and preferably four locking tabs with two on each side of the pod, for engaging receptacles provided in the body member when the cover member is installed on the body member.

The major distinction of the present invention novel structure from that of the prior art structure is that the latch means operates in a linear manner, instead of in a rotary manner such that the torque of a DC motor has little effect on the opening or closing of the latch means.

The present invention novel structure corrects the problems occurred in the conventional structure when a DC motor must be used to turn a latch key inserted into latch holes in the back of the cover member during the opening or closing of the cover member onto the cassette pod. The motion of the latch key in the door opener is changed from rotational to a linear movement in the present invention structure such that chances of malfunction of the door opener is drastically reduced. Instead of a DC motor with a required torque range, the present invention simply utilizes a pair of pneumatic cylinders for driving the latch keys in a linear direction. The tips of the latch keys can be advantageously shaped in a tapered shape such that the engagement of the latch keys with the latch holes positioned in the back of the cover member can be facilitated. The tapered head of the latch keys serves a self-guiding function in the engagement of the latch keys to the latch holes.

The present invention therefore discloses the modification of a door opener design in a loadport. The modification requires that the latch keys are driven by pneumatic cylinders, instead of by a DC motor as required in the conventional structure. The latch keys can be easily moved horizontally inside grooves that guide locking tabs to open or close a cassette pod door. In the present invention novel structure, a plurality, such as three guide pins, are further provided on the door opener plate in the loadport to engage guide pin holes in the cassette pod doors in order to accurately align the cassette door to the loadport.

Figure 4A:
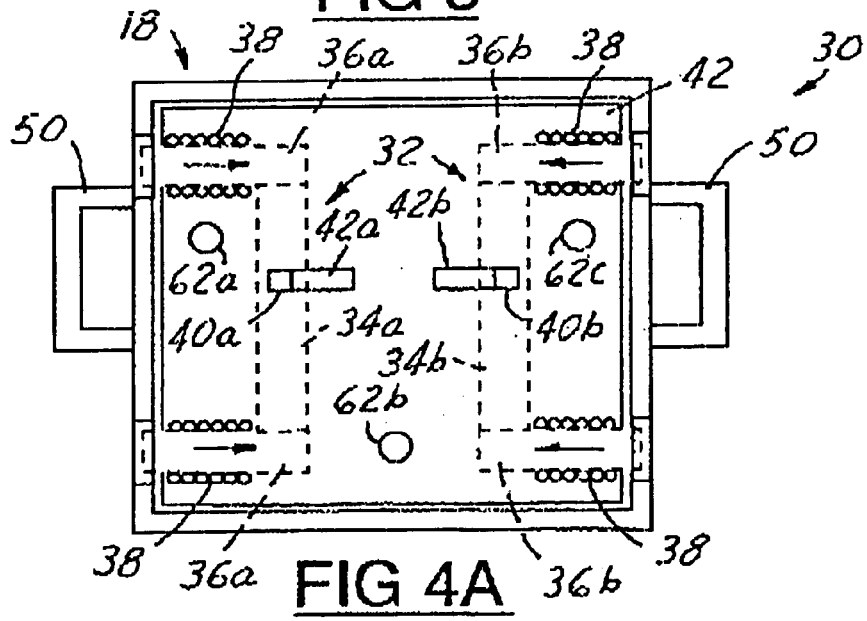
FIG. 4A is a rear view of the present invention door opening/closing mechanism situated in the cover member of the pod.

Referring now to FIG. 4A, wherein a present invention cassette door cover member is shown. The cassette door cover member 30 is installed onto a body member 18 which is equipped with handles 50. The cover member 30 is installed with a latch means 32 which includes two drive plates 34a, 34b, each connected to a pair of locking tabs 36a and 36b. Each of the pair of locking tabs 36a, 36b are spring-loaded by a spring 38 such that the locking tabs 36a, 36b are kept in a normal unlocked position, i.e. the locking tabs are retracted into the cover member 30.

The operation of the drive plates 34a, 34b and the locking tabs 36a and 36b are controlled by latch holes 40a and 40b provided in the drive plates 34a and 34b. Slots 42a and 42b are further provided in the back surface 42 of the cover member 30 in order to guide a pair of latch keys (see FIG. 4B) 44a and 44b in a linear movement.

Figure 4B:
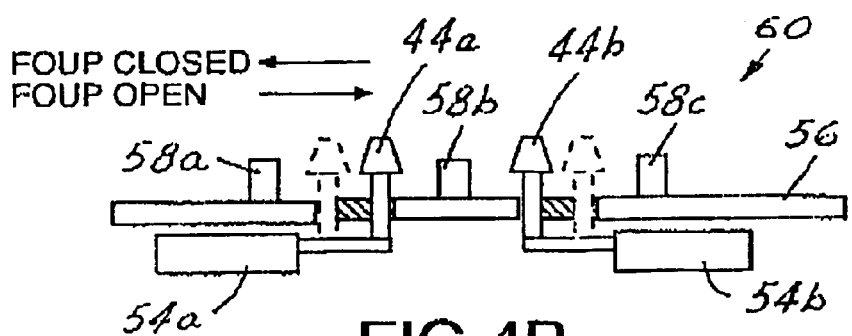
FIG. 4B is a side view of the latch keys operated by pneumatic cylinders that are situated in a door opener of a loadport.

The latch key mechanism 60, shown in FIG. 4B, is installed in a door opener mechanism (not shown) situated in a loadport (not shown). The door opening mechanism operates by a pair of pneumatic cylinders 54a and 54b which slide the latch keys 44a and 44b into the position that is shown in ghost lines. On top of the door closing mechanism plate 56, is further provided with at least two, and preferably three locating pins 58a, 58b and 58c for engaging locating holes 62a, 62b and 62c provided in the back surface 42 of the cover member 30. The locating pins 58a–58c and the locating holes 62a–62c ensure an accurate alignment between the door closing mechanism 60 and the cover member 30 during a door opening or door closing operation.

It should be noted that the latch keys 44a and 44b are formed in tapered shape such that it serves a self-guiding function for engaging the latch holes 40a and 40b in the cover member 30. The structure further includes an indicator means including means responsive to the position of said at least two latch holes to produce a signal related to the condition of said latch means.

The locking tabs 36a and 36b shown in FIG. 4A are in a released position such that the cover member 30 can be removed from the body member 18.

The present invention novel structure of a pod for transporting a cassette of semiconductor wafers that is equipped with a linearly operated door opening/closing mechanism has therefore been amply described in the above description and in the appended drawings of FIGS. 4A and 4B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A pod for transporting a cassette of semiconductor wafers, comprising:

a body member constructed of a top wall, a bottom wall, a front wall and two sidewalls forming a back opening for loading or unloading wafers into or out of said body member;

a cover member for sealingly and removably engaging said back opening of the body member; and latch means carried on said cover member for latching said cover member onto said body member, said latch means being actuatable and operable linearly from a latched condition in which said cover member is latched onto said body member to a released condition allowing removal of said cover member from said body member when engaged linearly by a latch key of a door opener situated in a loadport onto which said pod is positioned, said latch means further comprises at least two spring-loaded locking tabs for engaging receptacles provided in said body member and for returning said at least two spring-loaded locking tabs to a disengaged position.

2. A pod for transporting a cassette of semiconductor wafers according to claim 1, wherein said latch means further comprises a drive plate operably connected to said at least two locking tabs such that said at least two locking tabs are drivable by said drive plate to shift said latch means between a latching and an unlatching condition.

3. A pod for transporting a cassette of semiconductor wafers according to claim 1, wherein said at least two locking tabs being operated in a linear manner when engaging or disengaging said receptacles.

4. A pod for transporting a cassette of semiconductor wafers according to claim 1, wherein said latch means further comprises two latch holes for linearly engaging said latch key of the door opener in said loadport through a drive plate.

5. A pod for transporting a cassette of semiconductor wafers according to claim 4, wherein each one of said two latch holes operates at least one locking tab for engaging one of two opposite sides of a loadport opening.

6. A pod for transporting a cassette of semiconductor wafers according to claim 4, wherein said two latch holes move in a linear manner to linearly engage at least two locking tabs of said latch means to an opening of said loadport.

* * * * *